(12) United States Patent
Takahashi et al.

(10) Patent No.: US 6,255,746 B1
(45) Date of Patent: Jul. 3, 2001

(54) SWITCH OPERATION PROCESSING APPARATUS AND METHOD

(75) Inventors: Tadashi Takahashi, Saitama; Hiroyuki Kobayashi, Tokyo, both of (JP)

(73) Assignee: Asahi Kogaku Kogyo, Tokyo (JP)

( * ) Notice: Subject to any disclaimer, the term of this patent is extended or adjusted under 35 U.S.C. 154(b) by 0 days.

(21) Appl. No.: 09/277,759

(22) Filed: Mar. 29, 1999

(30) Foreign Application Priority Data

Mar. 30, 1998 (JP) .................................................. 10-101961

(51) Int. Cl.$^7$ ...................................................... H01H 43/00
(52) U.S. Cl. ............................................ 307/112; 307/116
(58) Field of Search ..................................... 307/112, 116, 307/40; 361/171, 172

(56) References Cited

U.S. PATENT DOCUMENTS

| | | | |
|---|---|---|---|
| 4,447,798 | * 5/1984 | Shapiro | 377/55 |
| 4,695,942 | 9/1987 | Levine et al. | |
| 5,390,119 | * 2/1995 | Oo et al. | 364/426.04 |
| 5,473,204 | * 12/1995 | Temple | 307/141 |
| 5,563,547 | * 10/1996 | Blanchard et al. | 327/484 |
| 6,108,097 | * 8/2000 | Suzuki et al. | 358/1.13 |

* cited by examiner

*Primary Examiner*—Josie Ballato
*Assistant Examiner*—Robert Deberadinis
(74) *Attorney, Agent, or Firm*—Greenblum & Bernstein, P.L.C.

(57) ABSTRACT

A switch operation processing apparatus for use with a manually operable switch and a controlled device, for controlling the controlled device depending on switch operation of the manually operable switch. The apparatus detects any occurrence of switch operation of the manually operable switch, determines when a predefined temporal pattern of switch operation of the manually operable switch occurs and controls the controlled device depending on the determination. The apparatus may reduce or eliminate any inconvenience which otherwise could be caused by an unintentional, inadvertent operation of the manually operable switch made by the operator, Also, the apparatus may achieve bidirectional adjustment of a controlled device through manual operation of a simple electric switch, such as a push button switch.

46 Claims, 8 Drawing Sheets

FIG. 8

| INTENSITY LEVEL | VALUE OF vb |
|---|---|
| −5 | 1 |
| −4 | 2 |
| −3 | 3 |
| −2 | 4 |
| −1 | 5 |
| 0 | 6 |
| +1 | 7 |
| +2 | 8 |
| +3 | 9 |
| +4 | 10 |
| +5 | 11 |
| +5 | 12 |

SWITCH OPERATION PROCESSING APPARATUS AND METHOD

The present disclosure relates to subject matter contained in Japanese Patent Application No. Hei-10-101961 filed on Mar. 30, 1998, which is expressly incorporated herein by reference in its entirety.

BACKGROUND OF THE INVENTION

1. Field of the Invention

The present invention relates to switch operation processing apparatus and method, for use with a manually operable switch and a controlled device, for controlling the controlled device depending on switch operation of the manually operable switch. The apparatus and method are useful for various purposes, and in particular, for application to switches and devices provided on an endoscope system.

2. Description of the Related Art

Recently, there have been commonly used electronic endoscope systems including a color video system which produces video signals representing a high-resolution color image of an object to be observed through the endoscope. A typical electronic endoscope system includes an endoscope processor unit, an electronic unit, serving to control various operations of the electronic endoscope system as well as to process the video signals received from an image sensing device of the video system. A typical endoscope process or unit has a control panel on which a large number of controls and switches are provided, including a control for adjustment in the intensity level of the illumination beam for illuminating an object to be observed through the endoscope, an enhancement on/off switch for activating and inactivating an image enhancer for the contour correction of the image of the object, a set of controls for obtaining the color balance among red (R), green (G) and blue (B) color signals, etc.

The operator of such an electronic endoscope system has to be skilled for appropriately operating or manipulating the large number of controls and switches provided on the system. If poorly skilled, the operator could make unintentional, inadvertent operations of the controls and switches. For example, poorly skilled operators often make an unintentional, inadvertent touch to the image enhancement on/off switch to inactivate the image enhancer. In such a case, a sudden deterioration in quality of an image displayed on a monitor screen of the electronic endoscope system may occur, and the operator may even erroneously recognize it as a failure of the video system in the electronic endoscope system.

SUMMARY OF THE INVENTION

In view of the foregoing, it is an object of the present invention to provide a switch operation processing apparatus for use with a manually operable switch and a controlled device, for controlling the controlled device depending on switch operation of the manually operable switch, wherein the apparatus may reduce or eliminate any inconvenience which otherwise could be caused by an unintentional, inadvertent operation of the manually operable switch made by the operator.

It is another object of the present invention to provide such a switch operation processing apparatus, wherein the apparatus may achieve bidirectional adjustment of a controlled device through manual operation of a simple electric switch, such as a push button switch.

It is a further object of the present invention to provide a method of processing operation of a manually operable switch, for controlling a controlled device depending on switch operation of the manually operable switch, wherein the method may reduce or eliminate any inconvenience which otherwise could be caused by an unintentional, inadvertent operation of the manually operable switch made by the operator.

It is a still further object of the present invention to provide such a method, wherein the method may achieve bidirectional adjustment of a controlled device through manual operation of a simple electric switch, such as a push button switch.

In accordance with one aspect of the present invention, there is provided a switch operation processing apparatus for use with a manually operable switch and a controlled device, for controlling the controlled device depending on switch operation of the manually operable switch. The apparatus comprises detection means for detecting any occurrence of switch operation of the manually operable switch, determination means for determining when a predefined temporal pattern of switch operation of the manually operable switch occurs, and control means for controlling the controlled device depending on determination made by the determination means.

In accordance with another aspect of the present invention, there is provided a switch operation processing apparatus for use with an endoscope system including a manually operable switch and a controlled device, for controlling the controlled device depending on switch operation of the manually operable switch. The apparatus comprises detection means for detecting any occurrence of switch operation of the manually operable switch, determination means for determining when a predefined temporal pattern of switch operation of the manually operable switch occurs, and control means for controlling the controlled device depending on determination made by the determination means.

In accordance with a further aspect of the present invention, there is provided a method of processing operation of a manually operable switch, for controlling a controlled device depending on switch operation of the manually operable switch. The method comprises the steps of detecting any occurrence of switch operation of the manually operable switch, determining when a predefined temporal pattern of switch operation of the manually operable switch occurs, and controlling the controlled device depending on the determination.

The determination means may be capable of determining when a first predefined temporal pattern of switch operation of the manually operable switch occurs and determining when a second predefined temporal pattern of switch operation of the manually operable switch occurs. In such case, the first predefined temporal pattern of switch operation of the manually operable switch may comprise two successive switch operations of the manually operable switch with a time interval therebetween shorter than a predetermined time interval. Further, the second predefined temporal pattern of switch operation of the manually operable switch may comprise a single, isolated operation of the manually operable switch with neither preceding switch operation thereof having occurred within the predetermined time interval before that switch operation nor following switch operation thereof occurring within the predetermined time interval after that switch operation.

The controlled device may be capable of placement in either of two states comprising first and second states. In such case, the control means may place the controlled device in one of the two states when an occurrence of the first predefined temporal pattern of switch operation of the manually operable switch is determined. Further, the control means may place the controlled device in the other of the two states when an occurrence of the second predefined temporal pattern of switch operation of the manually operable switch is determined. The two states of the controlled device may be active and inactive states of the controlled device.

The controlled device may be capable of adjustment in two opposite directions. In such case, the control means may make adjustment of the controlled device in one of the two opposite directions when an occurrence of the first predefined temporal pattern of switch operation of the manually operable switch is determined. Further, the control means may make adjustment of the controlled device in the other of the two opposite directions when an occurrence of the second predefined temporal pattern of switch operation of the manually operable switch is determined. The controlled device may be capable of adjustment in its output level and the two opposite directions of adjustment may be increasing and decreasing directions of adjustment in the output level of the controlled device.

The manually operable switch may be a two-position switch having a non-operated, normal position and an operated position at which the two-position switch is kept only when being manually operated.

BRIEF DESCRIPTION OF THE DRAWINGS

The above and other objects, features and advantages of the present invention will be apparent from the following detailed description of preferred embodiments thereof, reference being made to the accompanying drawings, in which:

FIG. 8 is a table showing the relationship between a set of illumination beam intensity levels and a set of values of a variable vb used for illumination adjustment purposes.

DETAILED DESCRIPTION OF PREFERRED EMBODIMENTS

Referring now to the accompanying drawings, preferred embodiments of the present invention will be described in detail.

Figure 1:
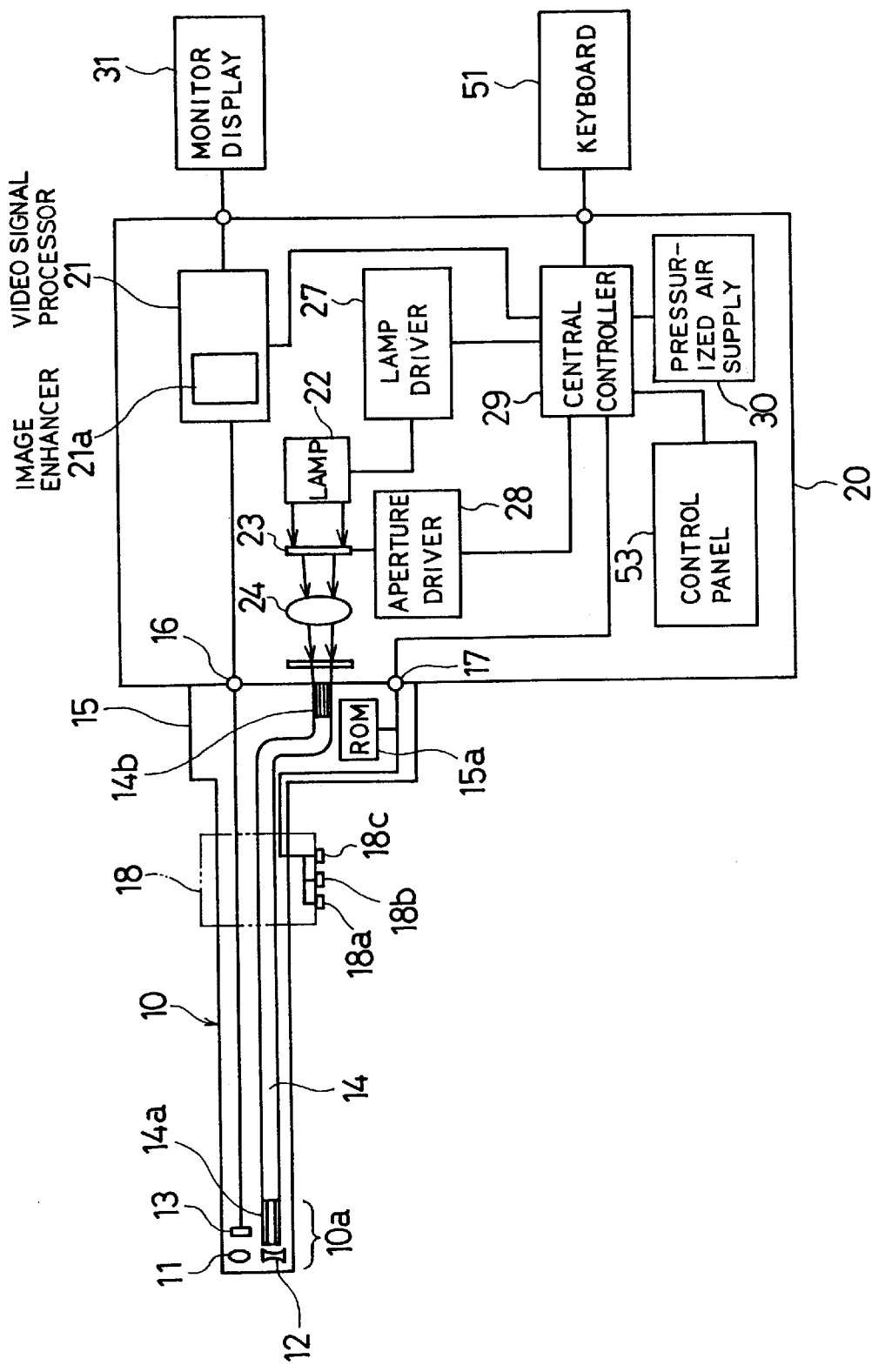
FIG. 1 is a schematic showing an electronic endoscope system including a switch operation processing apparatus realized by software in accordance with the present invention.

FIG. 1 is a schematic showing an electronic endoscope system including a switch operation processing apparatus implemented by software in accordance with the present invention. As shown, the electronic endoscope system comprises an endoscope 10 and an endoscope processor unit 20 connected to the endoscope 10. The system further comprises a monitor display 31 (such as, a cathode-ray tube display) and a keyboard 51 both connected to the endoscope processor unit 20.

The endoscope 10 is an elongate, flexible, tubular member which may be inserted into a cavity of a human body or the like. The endoscope 10 has an endoscope head 10a at the distal end thereof. The endoscope head 10a has an objective lens 11 and an illumination lens 12 disposed therein. The endoscope head 10a also has a solid-state image sensing device 13 disposed therein, which may be a charge-coupled-device (CCD), for example. The image sensing device 13 has an image-bearing surface onto which an image of the object to be observed through the endoscope system is formed by means of the objective lens 11.

The endoscope 10 has a fiber optic light guide 14, comprising a bundle of optical fibers, to guide illumination light through the entire length of the endoscope 10 to the endoscope head 10a. The fiber optic light guide 14 has its distal end 14a so located as to face to the rear side of the illumination lens 12, such that the light beam exiting the distal end of the light guide 14 enters the illumination lens 12. The illumination lens 12 diverges the light beam from the light guide 14 to provide a large angle of illumination for the object to be observed. Reflected light from the object is collected by the objective lens 11, which forms an image of the object on the image-bearing surface of the image sensing device 13, so that video signals representing that image are produced and outputted from the image sensing device 13.

The endoscope 10 has a connector unit 15 provided at its proximal end. Further, the endoscope 10 has a handpiece (or control grip) 18 provided between the endoscope head 10a and the connector unit 15. The handpiece 18 includes a housing adapted to be held by a hand of a human operator, such as a physician. A number of switches 18a, 18b and 18c, called hereinafter the "scope switches", are provided on the handpiece 18. The scope switches are adapted to be manually operated by the operator in order to control some of various operations and functions of the electronic endoscope system.

The connector unit 15 has a housing which is adapted for detachable connection to the endoscope processor unit 20. The endoscope 10 has a read-only-memory (ROM) 15a housed in the connector unit 15 for storing device-specific data representing various specifications of that particular endoscope 10. When the connector unit 15 is in physical connection to the endoscope processor unit 20, a first pair of electric connectors 16 provides electrical connection of the image sensing device 13 in the endoscope 10 to the endoscope processor unit 20, for transmitting appropriate control signals from the latter to the former and video signals from the former to the latter. Also, a second pair of electric connectors 17 provides electrical connection of both the ROM 15a and the scope switches 18a, 18b and 18c in the endoscope 16 to the endoscope processor unit 20. The fiber optic light guide 14 has its proximal end 14b located in the connector unit 15 such that the illumination light beam from the endoscope processor unit 20 may enter into the proximal end 14b of the light guide 14.

The endoscope 10 further includes a pressurized air supply tube (not shown) extending through the entire length of the endoscope 10, for supplying pressurized air from the endoscope processor unit 20 to the endoscope head 10a. The supplied pressurized air is used for known purposes, such as inflating the cavity into which the endoscope head 10 has been inserted.

The endoscope processor unit 20 comprises a microprocessor-based central controller 29, which serves to control various components and elements of the electronic endoscope system in order to provide appropriate operations and functions of the electronic endoscope system. The endoscope processor unit 20 further comprises a control panel 53 on which a number of switches 53a, 53b, 53c, 53d, 53e, . . . ,53n (FIG. 2), called hereinafter the "panel switches", are provided. The panel switches are adapted to be manually operated by the operator in order to control some of various operations and functions of the electronic endoscope system.

The central controller 29 provides control functions in accordance with the data and commands provided by the operator through his/her manual operation of the keyboard 51, the scope switches 18a–18c and the panel switches 53a–53n.

The endoscope processor unit 20 further comprises a video signal processor 21 for processing the video signals received from the image sensing device 13 before outputting them to the monitor display 31 and to the central controller 29. The video signal processor 21 includes several functional sections including, among others, an image enhancer 21a for providing contour correction of an image represented by the video signals. The monitor display 31 has a display screen on which an image of the object being observed through the endoscope 10 may be displayed.

The endoscope processor unit 20 further comprises an electric lamp 22 for generating illumination light to be transmitted through the fiber optic light guide 14 to the endoscope head 10a. A variable aperture stop 23 and a condenser lens 24 are disposed in front of the lamp 22. The illumination light generated by the lamp 22 is metered by the variable aperture stop 23 and converged by the condenser lens 24 into the proximal end (or the light receiving end) 14b of the fiber optic light guide 14 in the endoscope 10.

The endoscope processor unit 20 further comprises a lamp driver 27 for turning on/off the lamp 22 depending on appropriate command signals received from the central controller 29 and an aperture driver 28 for controlling the effective aperture of the variable aperture stop 23 depending on, again, appropriate command signals received from the central controller 29. Thus, the combination of the lamp 22 and the lamp driver 27 forms a light source, while the combination of the variable aperture stop 23 and the aperture driver 28 forms a control device for controlling the intensity level of the illumination beam.

The endoscope processor unit 20 further comprises a pressurized air supply 30 which is connectable to the pressurized air supply tube (not shown) in the endoscope 10 and is capable of adjusting the pressure of the supplied air under the control of the central controller 29.

The above described panel switches 53a–53n include, among others, a lamp on/off switch 53a for turning on/off the lamp 22, an image enhancement on/off switch 53b for activating and inactivating the image enhancer 21a, an illumination adjustment switch 53c for making adjustment in the intensity level of the illumination beam, an illumination adjustment mode selection switch 53d for making selection between the automatic and manual illumination adjustment modes and an air pressure adjustment switch 53e for making adjustment in the pressure level of the air supplied through the endoscope 10.

Figure 2:
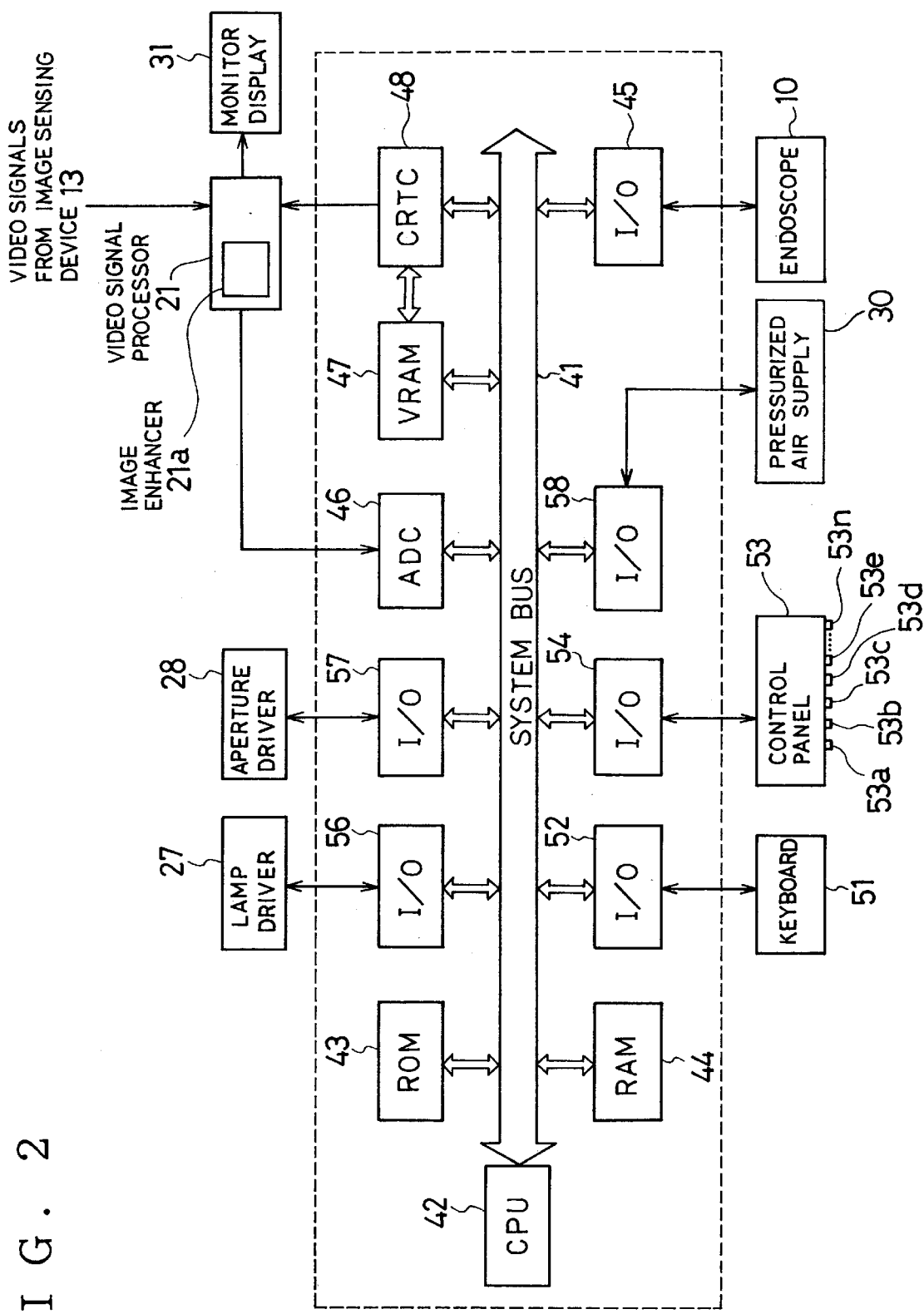
FIG. 2 is a block diagram showing a microprocessor-based central controller used in the electronic endoscope system of FIG. 1.

FIG. 2 is a block diagram showing the central controller 29 in greater detail. As shown, the central controller 29 comprises a system bus 41 to which a central processing unit (CPU) 42, a read-only-memory (ROM) 43 and a random-access-memory (RAM) 44 are connected. The CPU 42 controls various components and elements in the central controller 29. The ROM 43 stores appropriate data and programs. The RAM 44 provides both a work area and a storage area appropriately defined therein.

The ROM 15a and the scope switches 18a–18c provided in and on the endoscope 10 are connected through an input/output (I/O) interface 45 to the system bus 41, so that the central controller 29 is capable of reading the data stored in the ROM 15a and detecting the status of the scope switches 18a–18c.

The central controller 29 further comprises an analogue-to-digital converter (ADC) 46, a video RAM (VRAM) 47 and a cathode-ray-tube controller (CRTC) 48, all of which are connected to the system bus 41. The video signals provided from the image sensing device 13 to the video signal processor 21 are analogue signals and include a luminance signal. The luminance signal is routed from the video signal processor 21 to the ADC 46 and converted thereby into the corresponding digital signal. The VRAM 47 stores character codes, which may be written in accordance with the signals produced from the keyboard 51 and be provided to the CRTC 48. The CRTC 48 creates video signals representing appropriate characters and/or symbols based on the character codes read out from the VRAM 47. These video signals are supplied to the video signal processor 21 and added to the video signals from the image sensing device 13 in the video signal processor 21. The resultant video signals are outputted to the monitor display 31, and the image of the object being observed through the endoscope 10 is displayed on the screen of the monitor display 31 along with the characters/symbols superimposed on that image.

The central controller 29 further comprises a second I/O interface 52, a third I/O interface 54, a fourth I/O interface 56, a fifth I/O interface 57 and a sixth I/O interface 58 for connecting, respectively, the keyboard 51, the panel switches 53a–53n on the control panel 53, the lamp driver 27, the aperture driver 28 and the pressurized air supply 30 to the system bus 41.

The panel switches 53a–53n are so-called push button switches. As known, a push button switch is a two-position switch having a non-operated, normal position and an operated position at which it is kept only when being manually operated by the operator. It makes the transition from the normal position to the operated position when operated by the operator with his/her finger tip. When his/her finger tip is removed, it returns to its normal position by means of a return spring or the like. A push button switch is so simple that it may be operated with ease; however, it often allows unintentional operation by an inadvertent touch of the operator's finger tip to it. Further, a push button switch itself provides only relatively simple function, so that two push button switches are required so far in order to achieve bidirectional adjustment in a level, quantity or the like. The present invention provides switch operation processing apparatus and method which may reduce or eliminate the occurrence of unintentional operation and requires only a single push button switch to achieve bidirectional adjustment.

Note that the apparatus and method of the present invention may be used with other types of electric switches which are analogous to a push button switch in function. Such switches include, for example, touch-sensitive switches and proximity switches.

The switch operation processing apparatus of the invention in accordance with the embodiment disclosed hereinafter is realized by a software program performed by the CPU 42 in the central controller 29. The switch operation processing apparatus serves to control a number of controlled devices depending on switch operation of respective, manually operable switches associated with the controlled devices. In this embodiment, the manually operable switches with which the invention is used are the lamp on/off switch 53a, the image enhancement on/off switch 53b and the illumination adjustment switch 53c. Accordingly, the controlled devices with which the invention is used are the light source (i.e., the lamp 22 with the lamp driver 27), the image enhancer 21a and the illumination beam intensity control device (i.e., the variable aperture stop 23 with the aperture driver 28). The use of the invention, however, is not limited to these switches and devices. In fact, the invention may be applied to various other switches and the associated devices as well.

For realizing the switch operation processing apparatus, three counters are implemented, by software, in the RAM 44 in the central controller 29. The counters include a lamp on/off counter vc1, an image enhancement on/off counter vc2 and an illumination adjustment counter vc3 associated with, respectively, the lamp on/off switch 53a, the image enhancement on/off switch 53b and the illumination adjustment switch 53c. The following description shows how to use the counters vc1, vc2 and vc3.

Figure 3:
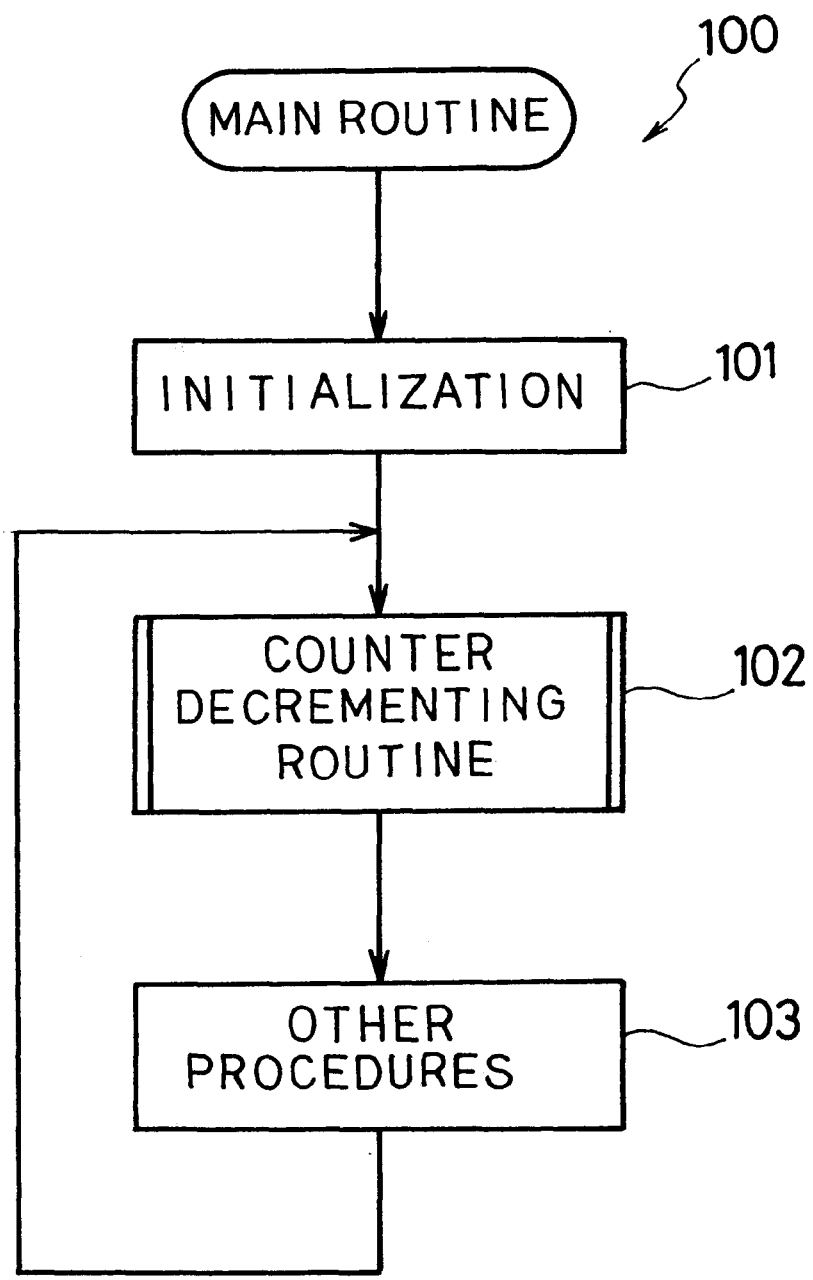
FIG. 3 is a flow diagram showing a main routine of the program for the procedures performed by the central controller of FIG. 2 in order to control various operations and functions of the electronic endoscope system of FIG. 1.

FIG. 3 is a flow diagram showing a main routine 100 performed by the CPU 42 in the central controller 29 in order to control various operations and functions of the electronic endoscope system. In step 101, initialization procedures are performed, in which each of the counters vc1, vc2 and vc3 is reset to zero. Then, in step 102, a counter decrementing routine is called, in which each of the counters vc1, vc2 and vc3 is decremented by one if that counter is not zero. Then, in step 103, appropriate procedures for any required operations and/or functions of the electronic endoscope system other than those related to the switches 53a, 53b and 53c are performed. Such operations and functions include, for example, the time display for displaying time indications on the screen of the monitor display 31. The process then loops back to step 102. Thereafter, steps 102 and 103 are continuously reiterated until the operator turns off the electronic endoscope system. The cycle time of the loop of the main routine 100 comprising steps 102 and 103 is about two milliseconds in this embodiment.

Figure 4:
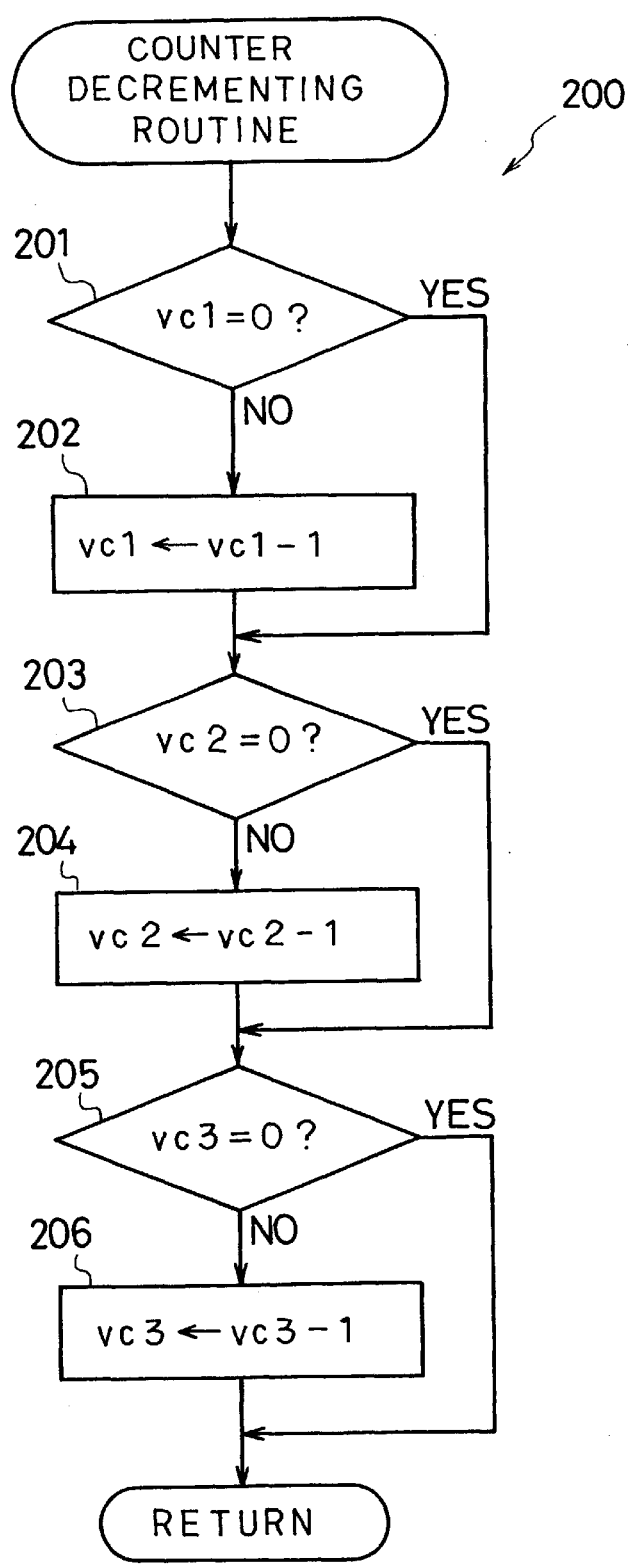
FIG. 4 is a flow diagram showing a counter decrementing routine included in the main routine of FIG. 3.

FIG. 4 is a flow diagram showing the counter decrementing routine 200 called in step 102 above. In step 201, it is determined whether the lamp on/off counter vc1 is zero. If so, the process skips step 202 to directly proceed to step 203. Otherwise, the process proceeds to step 202 to decrement the lamp on/off counter vc1 by one before proceeding to step 203. In step 203, it is determined whether the image enhancement on/off counter vc2 is zero. If so, the process skips step 204 to directly proceed to step 205. Otherwise, the process proceeds to step 204 to decrement the image enhancement on/off counter vc2 by one before proceeding to step 205. In step 205, it is determined whether the illumination adjustment counter vc3 is zero. If so, the process skips step 206 to return to the main routine 100 (Fi. 3). Otherwise, the process proceeds to step 206 to decrement the illumination adjustment counter vc3 by one before returning to the main routine 100.

As apparent from the above, if any of the counters vc1, vc2 and vc3 is not zero when the process goes through the counter decrementing routine 200, such counter will be decremented by one.

Figure 5:
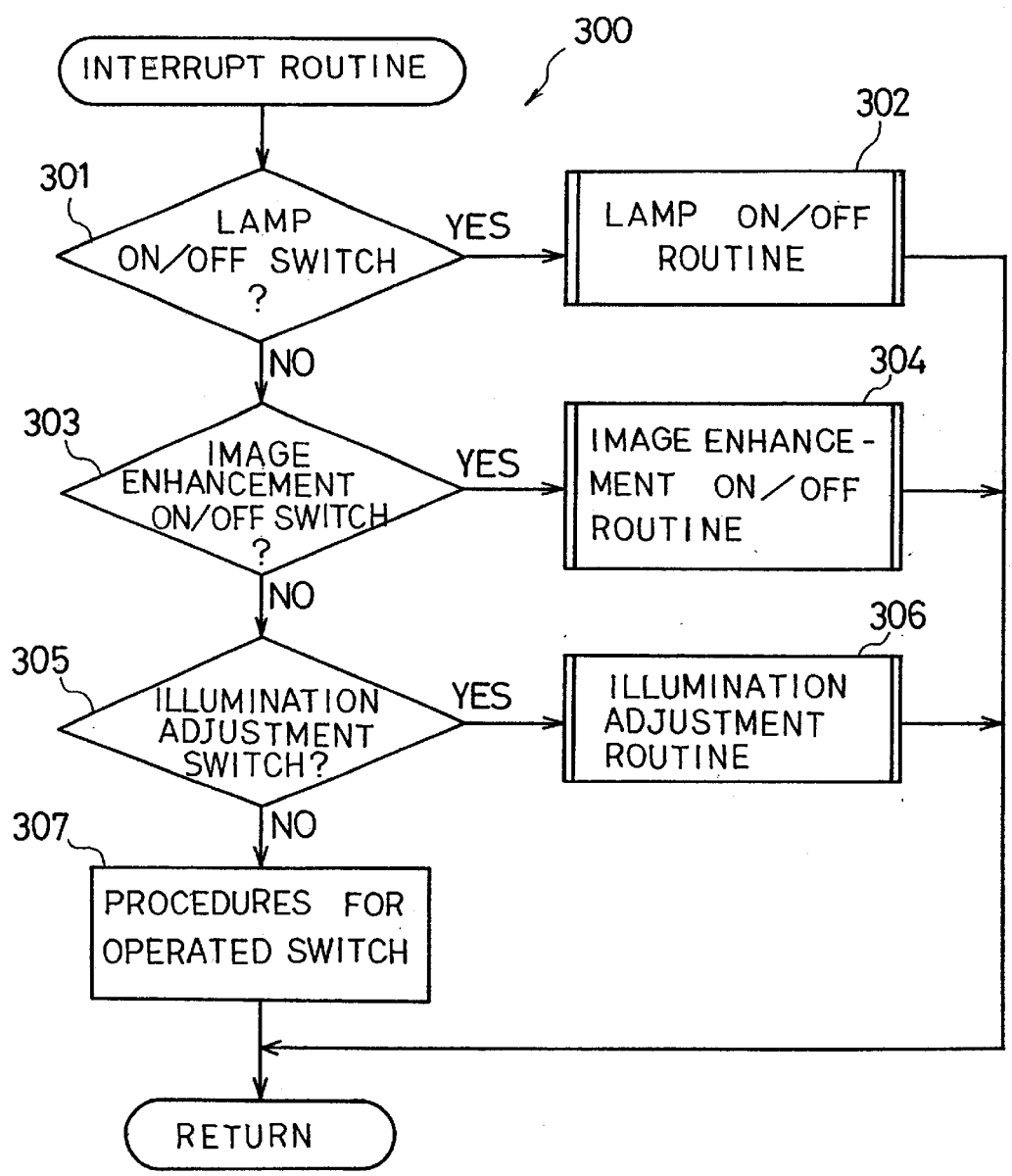
FIG. 5 is a flow diagram showing an interrupt routine for the procedures performed by the central controller of FIG. 2 in order to detect any occurrence of operation of manually operable switches provided on the electronic endoscope system of FIG. 1.

FIG. 5 is a flow diagram showing an interrupt routine 300, which is provoked by an interrupt to the CPU 42 caused whenever any of the switches provided on the electronic endoscope system is operated by the operator. In this manner, the CPU 42 detects any occurrence of switch operation made by the operator. In steps 301, 303 and 305, it is determined, respectively, whether the switch just operated to cause the interrupt is the lamp on/off switch 53a, whether it is the image enhancement on/off switch 53b and whether it is the illumination adjustment switch 53c. If the operated switch is the lamp on/off switch 53a, the process proceeds from step 301 to step 302. If it is the image enhancement on/off switch 53b, the process proceeds from step 303 to step 304. If it is the illumination adjustment switch 35c, the process proceeds from step 305 to step 306.

Thus, if the lamp on/off switch 53a is operated, the process goes through step 301 to step 302, where a lamp on/off routine (FIG. 6) is called, and then the process exits the interrupt routine 300 to return to the main routine 100. If the image enhancement on/off switch 52b is operated, the process goes through steps 301 and 303 to step 304, where an image enhancement on/off routine is called, and then the process exits the interrupt routine 300 to return to the main routine 100. Similarly, if the illumination adjustment switch 53c is operated, the process goes through steps 301, 303 and 305 to step 306, where an illumination adjustment routine (FIG. 7) is called, and then the process exits the interrupt routine 300 to return to the main routine 100.

Otherwise, i.e., if the switch whose operation has been just detected is one of the switches other than the above three switches 53a, 53b and 53c, then the process goes through steps 301, 303, 305 to step 307, where appropriate procedures for the operated switch are performed, and the process returns to the main routine 100.

Figure 6:
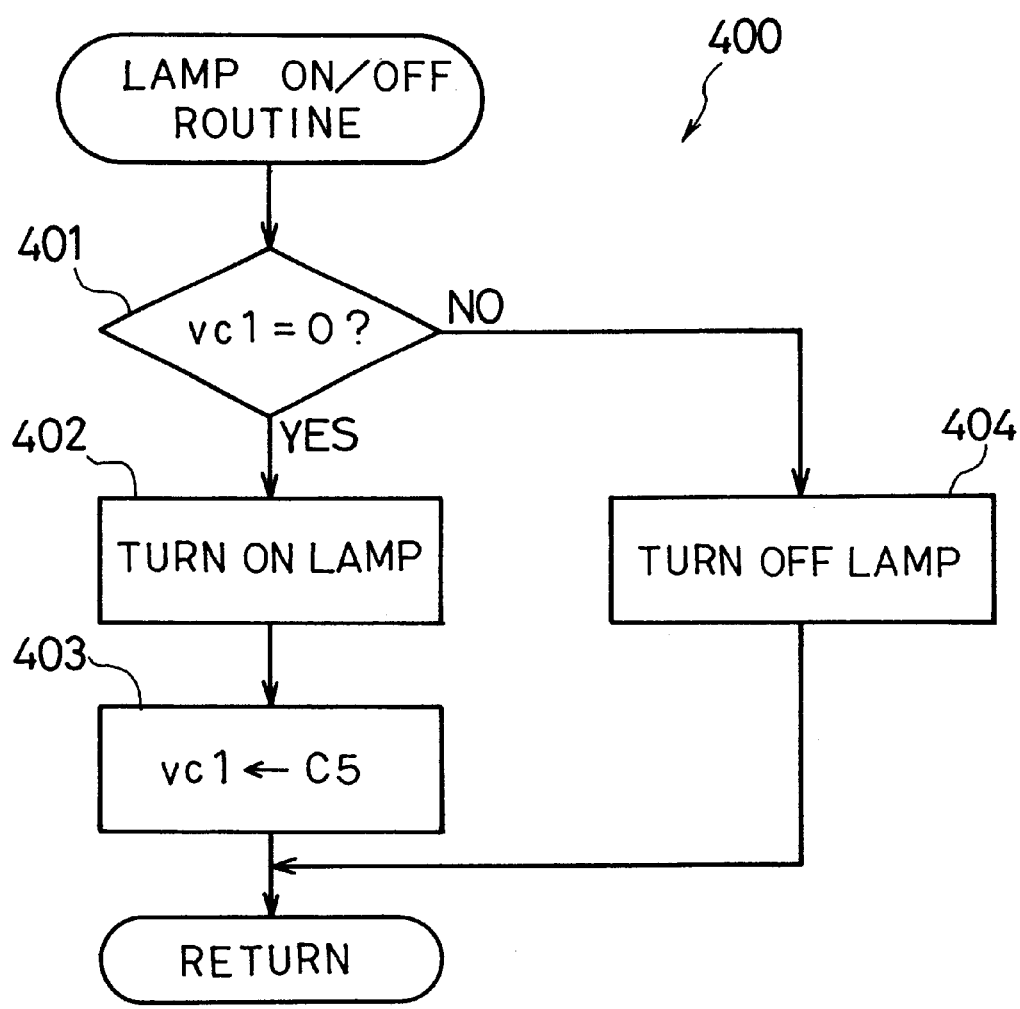
FIG. 6 is a flow diagram showing a lamp on/off routine included in the interrupt routine of FIG. 5.

FIG. 6 is a flow diagram showing the lamp on/off routine 400 called in step 302 above. In step 401, it is determined whether the lamp on/off counter vc1 is zero. Since the counter vc1 is reset to zero in the initialization procedures in step 101 (FIG. 3), it must be zero and thus the determination must be positive when the process goes through step 401 for the first time after the electronic endoscope system is activated. If the determination made in step 401 is positive, the process proceeds to step 402, where the lamp 22 (FIG. 1) is placed in active state, i.e., either turned on if it has been off or kept on if it has been already on. Then, in step 403, the counter vc1 is set to a predetermined count C5 before the process exits this routine 400 to return to the interrupt routine 300. The count C5 is selected to be two hundred in this embodiment.

As described above, the cycle time of the loop of the main routine 100 (FIG. 3) comprising steps 102 and 103 is about two milliseconds, so that the counter decrementing routine 200 (FIG. 4) is reiterated at these time intervals. Consequently, once set to two hundred in step 403, the counter vc1 is thereafter reiteratively decremented by one at time intervals of two milliseconds until it reaches zero. The counter vc1 reaches zero about 0.4 seconds after the point of time when it is set to two hundred because two-hundred times two milliseconds equals 0.4 seconds.

Thus, if two successive switch operations of the lamp on/off switch 53a occur with the time interval therebetween shorter than 0.4 seconds and the lamp on/off routine 400 is thereby provoked twice, then the counter vc1 is set to two hundred in step 403 during the first pass of the routine 400 provoked by the former switch operation, while it has not yet reached zero in step 401 during the second pass of the routine 400 provoked by the latter switch operation. In such case, the determination made in step 401 in the second pass of the routine 400 must be negative, so that the process proceeds to step 404, where the lamp 22 is placed in inactive state, i.e., turned off.

On the other hand, if there occurs a single, isolated operation of the lamp on/off switch 53a with neither preceding switch operation of the switch 53a having occurred within 0.4 seconds before that switch operation nor following switch operation of the switch 53a occurring within 0.4 seconds after that switch operation, then the determination made in step 401 in the pass of the routine 400 provoked by that switch operation must be positive, so that the process proceeds to step 402, where the lamp 22 is placed in active state.

In this arrangement, the switch operation sequence comprising two successive switch operations of the switch 53a with the time interval therebetween shorter than the predetermined time interval of 0.4 seconds is a first predefined temporal pattern of switch operation of the switch 53a, while the switch operation sequence comprising a single, isolated operation of the switch 53a is a second predefined temporal pattern of switch operation of the switch 53a. The switch operation processing apparatus is capable of determining when each of the first and second temporal patterns of switch operation of the switch 53a occurs, and controls the light source depending on such determination. Here, the switch operation processing apparatus itself serves as a two-position switch for the light source, having on- and off-position. Depending on the detected temporal pattern of switch operation of the switch 53a, the apparatus changes its position between them. Specifically, in this arrangement, the apparatus changes its position from the on-position to the off-position only when two successive switch operations of the switch 53a occur with the time interval therebetween shorter than the predetermined time interval, while the apparatus is placed in the on-position when a single, isolated switch operation of the switch 53a occurs. Another arrangement is also contemplated in which the switch operation processing apparatus changes its position from the off-position to the on-position only when two successive switch operations of the associated switch occur with the time interval therebetween shorter than a predetermined time interval, while the apparatus is placed in the off-position when a single, isolated switch operation of the associated switch occurs.

As apparent from the above, the lamp 22 is never turned off unless two successive switch operations of the lamp on/off switch 53a occur with the time interval therebetween shorter than a relatively short, predetermined time interval (about 0.4 seconds in this embodiment). Generally, an unintentional, inadvertent operation of a push button switch may often occur as a single, isolated operation, whereas it is less probable that two successive such inadvertent switch operations occur within a relatively short time interval. Thus, the above technique serves to reduce or eliminate the occurrence of unintentional turning-off (or inactivation) of the lamp 22, which otherwise could be caused by an inadvertent operation of the lamp on/off switch 53a made by the operator.

Note that this arrangement does not serve to reduce the occurrence of unintentional turning-on (or activation) of the lamp 22, which may be also caused by inadvertent operation of the lamp on/off switch 53a made by the operator. This arrangement is based on our recognition that unintentional turning-on of the lamp 22 is less inconvenient than unintentional turning-off of the lamp 22, which may result in a sudden loss of the view through the endoscope. In other words, the on-state (active state) of the lamp 22 is chosen as the superior state and the off-state (inactive state) of the lamp 22 as the inferior state. The superior state is preferred to the inferior state.

The operation of the image enhancement on/off switch 53b is processed in the same manner as the operation of the lamp on/off switch 53a described above. The image enhancement on/off routine called in step 304 of the interrupt routine 300 is completely analogous to the lamp on/off routine 400 and thus not shown in the drawings for simplicity. In the image enhancement on/off routine, the image enhancement on/off counter vc2 is examined and set to a predetermined number when appropriate, all in identically the same manner as the lamp on/off counter vc1 in the lamp on/off routine 400, so that the image enhancer 21a is inactivated only when two successive switch operations of the image enhancement on/off switch 53b occur with the interval therebetween shorter than a predetermined time interval, which is selected to be about 0.4 seconds in this embodiment.

Here, the switch operation processing apparatus itself serves as a two-position switch for the image enhancer, having an on-position and an off-position. Depending on the detected temporal pattern of switch operation, the apparatus changes its position.

This serves to reduce or eliminate the occurrence of unintentional inactivation of the image enhancer 21a, while does not serve to reduce the occurrence of unintentional activation of the image enhancer 21a, which may be also caused by an inadvertent operation of the image enhancement on/off switch 53b made by the operator. This arrangement is base on our recognition that unintentional activation of the image enhancer 21a is less inconvenient than unintentional inactivation thereof, which may result in a sudden deterioration in quality of the displayed image being observed by the operator. Thus, for the image enhancement on/off switch 53b, the active state of the image enhancer 21a is chosen as the superior state and the inactive state thereof as the inferior state.

The basic concept underlying the above arrangement may be applied to still other switches provided on the electronic endoscope system. For example, the operation of the illumination adjustment mode selection switch 53d may be processed in the same manner. For the illumination adjustment mode selection switch 53d, it may be desirable that the automatic adjustment mode is chosen as the superior state and the manual adjustment mode as the inferior state.

Figure 7:
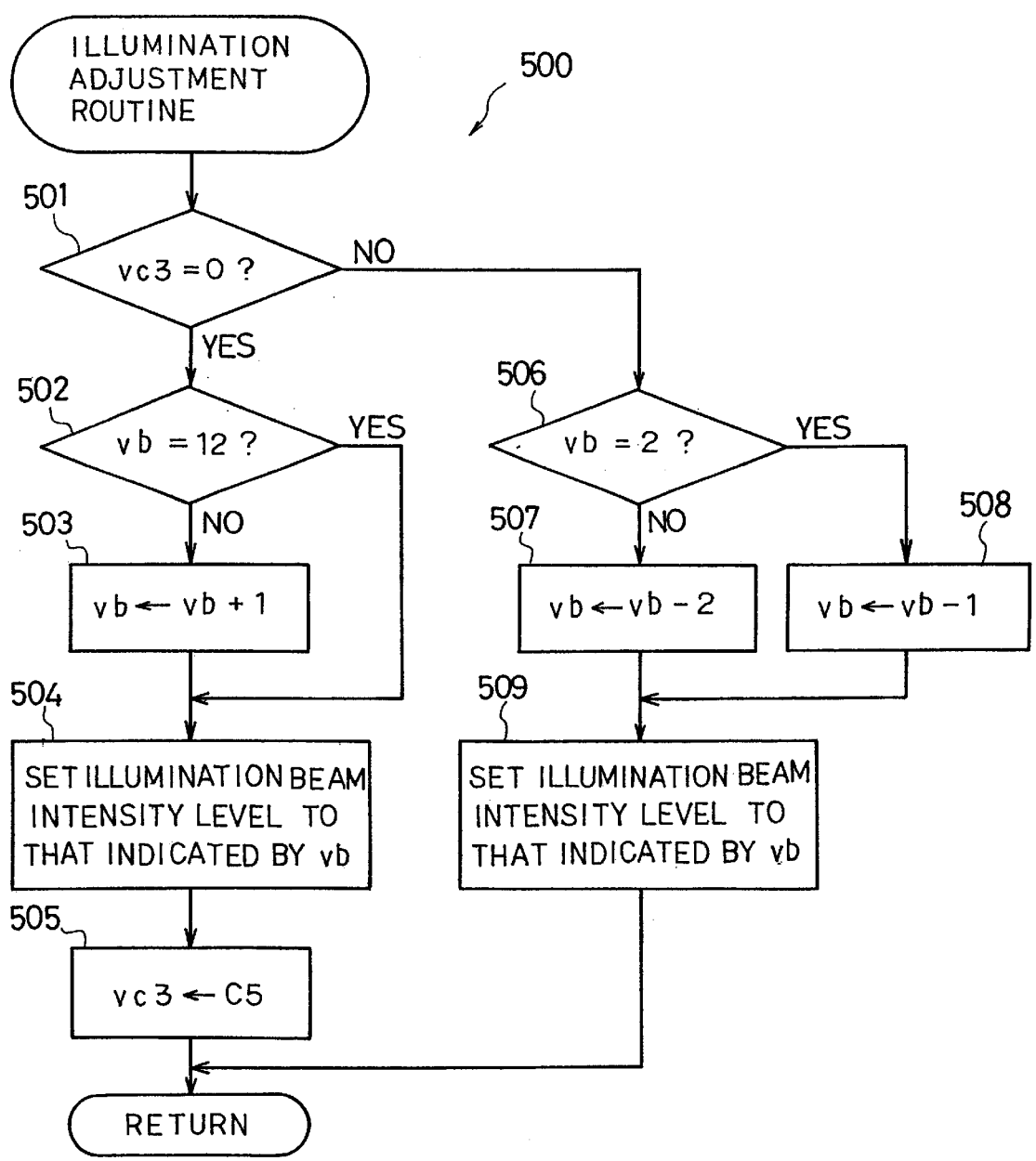
FIG. 7 is a flow diagram showing an illumination adjustment routine included in the interrupt routine of FIG. 5.

FIG. 7 is a flow diagram showing the illumination adjustment routine 500, which is called in step 306 of the interrupt routine 300 (FIG. 5), for making adjustment in the intensity level of the illumination beam as metered by the variable aperture stop 23 (FIG. 1). This routine 500 uses a variable vb in order to control the illumination beam intensity level. In the course of this routine 500, the variable vb may be set to one of positive integers from one to twelve inclusive and may be incremented or decremented among these integers. The central controller 29 controls the aperture driver 28 depending on the value of the variable vb to set the illumination beam intensity to a desired level. The levels to which the illumination beam intensity can be set are predefined, and include eleven levels in this embodiment. The relationship between the set of twelve possible values for the variable vb and the set of eleven possible levels for the illumination beam intensity is shown in a table of FIG. 8. As shown, the eleven possible intensity levels are indicated by index numbers −5 to +5 inclusive. Index numbers −5 and +5 represent, respectively, the lowest and the highest of the eleven levels, with higher index numbers representing higher levels. The twelve possible values for the variable vb have one-to-one correspondence to the intensity levels except two of the values, eleven and twelve, which correspond to the same intensity level indicated by index number +5 (the highest level). This relationship is required in this embodiment because a decrement in the intensity level is achieved as a double decrement after an increment in the intensity level, as described in great detail below.

When the endoscope system is activated, the variable vb is set to zero in the initialization procedures in step 101 of the main routine 100. In step 501 of the illumination adjustment routine 500, it is determined whether the illumination adjustment counter vc3 is zero. Since the counter vc3 is reset to zero in the initialization procedures in step 101, it must be zero when the process goes through step 501 for the first time after the endoscope system is activated. If the determination made in step 501 is positive, the process proceeds to step 502, where it is determined whether the current value of the variable vb is twelve, the maximum possible value for the variable vb. If not, the process proceeds to step 503, where the variable vb is incremented by one, and thence to step 504. Otherwise, i.e., if the current value of the variable vb is twelve in step 502, the process skips step 503 to directly proceed to step 504. In step 504, the variable aperture stop 23 is controlled to set the illumination beam intensity to the level that is indicated by the current value of the variable vb. Thus, if the current value of the variable vb is ten or less in step 502 just before the process reaches step 504, the illumination beam intensity level is changed in step 504 to the next higher level. Then, in step 505, the counter vc3 is set to the predetermined count C5 and the process returns to the interrupt routine 300 and thence to the main routine 100. The count C5 is selected to be two hundred in this embodiment, as described above.

As with the counters vc1 and vc2, once set to the predetermined count C5 (which is two hundred in this embodiment), the counter vc3 is thereafter reiteratively decremented by one at time intervals of about two milliseconds until it reaches zero. This is achieved in the course of reiteration of the counter decrementing routine 200 (FIG. 4). The counter vc3 reaches zero about 0.4 seconds after the point of time when it is set to two hundred because two-hundred times two milliseconds equals 0.4 seconds.

Therefore, if two successive switch operations of the illumination adjustment switch 53c occur with the time interval therebetween shorter than 0.4 seconds and the illumination adjustment routine 500 is provoked twice by these switch operations, then the counter vc3 is set to two hundred in step 505 during the first pass of the routine 500 provoked by the former switch operation, while it has not yet reached zero in step 501 during the second pass of the routine 500 provoked by the latter switch operation. In such case, the determination made in step 501 in the second pass of the routine 500 must be negative, so that the process proceeds to step 506, where it is determined whether the current value of the variable vb is two, which is the minimum possible value for the variable vb when the process has reached step 506. If not, the process proceeds to step 507, where the variable vb is decremented by two. Otherwise, i.e., if the current value of the variable vb is two in step 506, the process proceeds to step 508, where the variable vb is decremented by one and thus changed from two to one. From either of steps 507 and 508, the process proceeds to step 509, where the variable aperture stop 23 is controlled to set the illumination beam intensity level to the level that is indicated by the new value of the variable vb. The illumination beam intensity level is decreased thereby into one or two steps lower the level depending on whether the process has gone through step 508 or step 507 before the process reaches step 509. From step 509, the process returns to the interrupt routine 300 and thence to the main routine 100.

Referring again to the case where two successive switch operations of the illumination adjustment switch 53c occur with the time interval therebetween shorter than 0.4 seconds and the illumination adjustment routine 500 is provoked twice by these switch operations. The determination made in step 501 in the first pass of the routine 500 must be positive, so that a change in the illumination beam intensity level into the next higher level occurs during the first pass unless the intensity level is already set to the highest level (indicated by index number +5) when the first pass is commenced. Also, the determination made in step 501 in the second pass of the routine 500 must be negative, so that a change in the illumination beam intensity level into two steps lower the level occurs during the second pass unless the intensity level is already set to the next lowest level (indicated by index number −4) when the second pass is commenced.

Therefore, the total effect of the occurrence of two successive switch operations of the illumination adjustment switch 53c with the time interval therebetween shorter than 0.4 seconds, is an adjustment in the illumination beam intensity level into the next lower level unless the intensity level is already set to the lowest level when the two successive switch operations of the illumination adjustment switch 53c occur.

On the other hand, if there occurs a single, isolated operation of the illumination adjustment switch 53c with neither preceding switch operation of the switch 53c having occurred within 0.4 seconds before that switch operation nor following switch operation of the switch 53c occurring within 0.4 seconds after that switch operation, then the process does not go through steps 506, 507, 508 and 509 during the pass of the routine 500 provoked by that switch operation. Thus, the total effect of the occurrence of a single, isolated operation of the illumination adjustment switch 53c is an adjustment in the illumination beam intensity level into the next higher level unless the intensity level is already set to the highest level when the illumination adjustment switch 53c is operated.

In this arrangement, the switch operation sequence comprising two successive switch operations of the switch 53c with the time interval therebetween shorter than the predetermined time interval of 0.4 seconds is a first predefined temporal pattern of switch operation of the switch 53c, while the switch operation sequence comprising a single, isolated operation of the switch 53c is a second predefined temporal pattern of switch operation of the switch 53c. The switch operation processing apparatus is capable of determining when each of the first and second temporal patterns of switch operation of the switch 53c occurs, and controls the illumination beam intensity level control device depending on such determination. Here, the switch operation processing apparatus itself serves as a three-position switch for the illumination beam intensity level control device, having a first position for adjustment in one of two opposite directions (or a level increase position), a second position for adjustment in the other of the two directions (or a level decrease position) and a third, neutral position. Depending on the detected temporal pattern of switch operation of the switch 53c, the apparatus changes its position among them.

By virtue of the above arrangement, the illumination beam intensity level may be adjusted in the two opposite, increasing and decreasing directions through appropriate operations of the illumination adjustment switch 53c which comprises a single, push button switch. Without the present invention, two push button switches would be required to achieve such a bidirectional adjustment if one does not wish to use any switches more complicated than push button switches. Thus, the present invention may serve to reduce the number of push button switches required for such purposes. This is highly effective and desirable for an endoscope system because it is often difficult to provide an endoscope system with many switches, which could prohibit easy operation of the switches.

Further, the illumination beam intensity level can not be decreased unless two successive switch operations of the illumination adjustment switch 53c occur with the time interval therebetween shorter than a relatively short, predetermined time interval (about 0.4 seconds in this embodiment). As described, an unintentional, inadvertent operation of a push button switch may often occur as a single, isolated operation, whereas it is less probable that two successive such inadvertent switch operations occur within a relatively short time interval. Thus, the above technique serves to reduce or eliminate the occurrence of unintentional decrease in the illumination beam intensity level, which otherwise could be caused by an inadvertent operation of the illumination adjustment switch 53c made by the operator.

Note that this arrangement does not serve to reduce the occurrence of unintentional increase in the illumination beam intensity level, which may be also caused by an inadvertent operation of the illumination adjustment switch 53c made by the operator. This arrangement is based on our recognition that unintentional increase in the illumination beam intensity level is less inconvenient than unintentional decrease in the level, which may result in a sudden, unexpected darkening of the view through the endoscope. Thus, in this arrangement, the increase in the illumination beam intensity level is chosen as the adjustment in the superior direction and the decrease in the intensity level as the adjustment in the inferior direction. The change in the superior direction is preferred to that in the inferior direction.

The basic concept underlying the above arrangement may be also applied to other switches provided on the electronic endoscope system. For example, the operation of the air pressure adjustment switch 53e may be processed in the same manner as the illumination adjustment switch 53c. For the air pressure adjustment switch 53e, it may be desirable that the decrease in the pressure level of the supplied air is chosen as the adjustment in the superior direction and the increase in the pressure level as the adjustment in the inferior direction.

While in the above arrangements relatively simple temporal patterns of switch operation are used, other temporal patterns of switch operation may be also used. For example, a switch operation sequence comprising three or more successive switch operations with the time interval between the first and the last of the successive switch operations shorter than a predetermined time interval, may be used as the predefined temporal pattern of switch operation to be detected by the apparatus, if appropriate or desirable. Such temporal pattern of switch operation can be detected by using an appropriate combination of counters, which should be apparent to those skilled in the art after having read the present disclosure. Using more complicated temporal patterns may provide greater reduction of the occurrence of unintentional operations of the electronic endoscope system due to inadvertent switch operations made by the operator.

Having described the present invention with reference to the preferred embodiments thereof, it is to be understood that the present invention is not limited to the disclosed embodiments, but may be embodied in various other forms without departing from the spirit and the scope of the present invention as defined by the appended claims.

What is claimed is:

1. A switch operation processing apparatus for use with a manually operable switch and a controlled device, for controlling said controlled device depending on a switch operation of said manually operable switch, said apparatus comprising:

a detection circuit that detects any occurrence of a switch operation of said manually operable switch;

a determination system that determines when a first predefined temporal pattern of switch operation of said manually operable switch occurs, which comprises two successive switch operations of said manually operable switch with a time interval therebetween shorter than a predetermined time interval; and a controller controlling said controlled device depending on a determination made by said determination system.

2. A switch operation processing apparatus according to claim 1, wherein:

said determination system further determines when a second predefined temporal pattern of switch operation of said manually operable switch occurs.

3. A switch operation processing apparatus according to claim 2, wherein:

said second predefined temporal pattern of switch operation of said manually operable switch comprises a single, isolated operation of said manually operable switch without a preceding switch operation thereof having occurred within said predetermined time interval before said single, isolated operation and without a following switch operation thereof occurring within said predetermined time interval after said single, isolated operation.

4. A switch operation processing apparatus according to claim 2, wherein:

said controlled device is capable of placement in either of two states comprising first and second states;

said controller places said controlled device in one of said two states when an occurrence of said first predefined temporal pattern of switch operation of said manually operable switch is determined; and said controller places said controlled device in a remaining one of said two states when an occurrence of said second predefined temporal pattern of switch operation of said manually operable switch is determined.

5. A switch operation processing apparatus according to claim 4, wherein:

said two states of said controlled device are active and inactive states of said controlled device.

6. A switch operation processing apparatus according to claim 2, wherein:

said controlled device is capable of adjustment in two opposite directions;

said controller makes adjustment of said controlled device in one of said two opposite directions when an occurrence of said first predefined temporal pattern of switch operation of said manually operable switch is determined; and said controller makes adjustment of said controlled device in a remaining one of said two opposite directions when an occurrence of said second predefined temporal pattern of switch operation of said manually operable switch is determined.

7. A switch operation processing apparatus according to claim 6, wherein:

said controlled device is capable of adjustment in an output level thereof; and said two opposite directions of adjustment are increasing and decreasing directions of adjustment in said output level of said controlled device.

8. A switch operation processing apparatus according to claim 1, wherein:

said manually operable switch is a two-position switch having a non-operated, normal position and an operated position at which said two-position switch is kept only when being manually operated.

9. A switch operation processing apparatus according to claim 8, wherein:

said two-position switch is a push button switch.

10. A switch operation processing apparatus according to claim 8, wherein:

said two-position switch is a touch-sensitive switch.

11. A switch operation processing apparatus according to claim 8, wherein:

said two-position switch is a proximity switch.

12. A switch operation processing apparatus for use with an endoscope system including a manually operable switch and a controlled device, for controlling said controlled device depending on a switch operation of said manually operable switch, said apparatus comprising:

a detection circuit that detects any occurrence of a switch operation of said manually operable switch;

a determination system that determines when a first predefined temporal pattern of switch operation of said manually operable switch occurs, which comprises two successive switch operations of said manually operable switch with a time interval therebetween shorter than a predetermined time interval; and a controller controlling said controlled device depending on a determination made by said determination system.

13. A switch operation processing apparatus according to claim 12, wherein:

said determination system further determines when a second predefined temporal pattern of switch operation of said manually operable switch occurs.

14. A switch operation processing apparatus according to claim 13, wherein:

said second predefined temporal pattern of switch operation of said manually operable switch comprises a single, isolated operation of said manually operable switch without a preceding switch operation thereof having occurred within said predetermined time interval before said single, isolated operation and without a following switch operation thereof occurring within said predetermined time interval after said single, isolated operation.

15. A switch operation processing apparatus according to claim 13, wherein:

said controlled device is capable of placement in either of two states comprising first and second states;

said controller places said controlled device in one of said two states when an occurrence of said first predefined temporal pattern of switch operation of said manually operable switch is determined; and said controller places said controlled device in the other of said two states when an occurrence of said second predefined temporal pattern of switch operation of said manually operable switch is determined.

16. A switch operation processing apparatus according to claim 15, wherein:

said two states of said controlled device are active and inactive states of said controlled device.

17. A switch operation processing apparatus according to claim 13, wherein:

said controlled device is capable of adjustment in two opposite directions;

said controller makes adjustment of said controlled device in one of said two opposite directions when an occurrence of said first predefined temporal pattern of switch operation of said manually operable switch is determined; and said controller makes adjustment of said controlled device in the other of said two opposite directions when an occurrence of said second predefined temporal pattern of switch operation of said manually operable switch is determined.

18. A switch operation processing apparatus according to claim 17, wherein:

said controlled device is capable of adjustment in an output level thereof; and said two opposite directions of adjustment are increasing and decreasing directions of adjustment in said output level of said controlled device.

19. A switch operation processing apparatus according to claim 12, wherein:

said manually operable switch is a two-position switch having a non-operated, normal position and an operated position at which said two-position switch is kept only when being manually operated.

20. A switch operation processing apparatus according to claim 19, wherein:

said two-position switch is a push button switch.

21. A switch operation processing apparatus according to claim 19, wherein:

said two-position switch is a touch-sensitive switch.

22. A switch operation processing apparatus according to claim 19, wherein:

said two-position switch is a proximity switch.

23. A switch operation processing apparatus according to claim 12, wherein:

said endoscope system including a light source for generating light for illuminating an object to be observed through said endoscope system and a lamp on/off switch for activating and inactivating said light source;

said manually operable switch comprises said lamp on/off switch; and said controlled device comprises said light source.

24. A switch operation processing apparatus according to claim 12, wherein:

said endoscope system including an image enhancer that makes image enhancement to video signals representing an image of an object to be observed through said endoscope system and an image enhancement on/off switch for activating and inactivating said image enhancer;

said manually operable switch comprises said image enhancement on/off switch; and said controlled device comprises said image enhancer.

25. A switch operation processing apparatus according to claim 12, wherein:

said endoscope system including an illumination beam intensity control device that controls intensity level of an illumination beam for illuminating an object to be observed through said endoscope system and an illumination adjustment switch for making adjustment in intensity level of said illumination beam;

said manually operable switch comprises said illumination adjustment switch; and said controlled device comprises said illumination beam intensity control device.

26. A switch operation processing apparatus according to claim 12, wherein:

said endoscope system including a pressurized air supply capable of adjusting pressure of supplied air and an air pressure adjustment switch for making adjustment in pressure level of said supplied air;

said manually operable switch comprises said air pressure adjustment switch; and said controlled device comprises said pressurized air supply.

27. A method of processing operation of a manually operable switch, for controlling a controlled device depending on switch operation of said manually operable switch, said method comprising:

detecting any occurrence of switch operation of said manually operable switch;

determining when a first predefined temporal pattern of switch operation of said manually operable switch occurs, which comprises two successive switch operations of said manually operable switch with a time interval therebetween shorter than a predetermined time interval; and controlling said controlled device depending on said determination.

28. The method of claim 27, further comprising the step of:

determining when a second predefined temporal pattern of switch operation of said manually operable switch occurs.

29. The method of claim 28, wherein:

said second predefined temporal pattern of switch operation of said manually operable switch comprises a single, isolated operation of said manually operable switch without a preceding switch operation thereof having occurred within said predetermined time interval before said single, isolated operation and without a following switch operation thereof occurring within said predetermined time interval after said single, isolated operation.

30. The method of claim 28, wherein:

said controlled device is capable of placement in either of two states comprising first and second states; and said controlling comprises:

placing said controlled device in one of said two states when an occurrence of said first predefined temporal pattern of switch operation of said manually operable switch is determined; and placing said controlled device in the other of said two states when an occurrence of said second predefined temporal pattern of switch operation of said manually operable switch is determined.

31. The method of claim 30, wherein:

said two states of said controlled device are active and inactive states of said controlled device.

32. The method of claim 28, wherein:

said controlled device is capable of adjustment in two opposite directions; and said controlling comprises:

making adjustment of said controlled device in one of said two opposite directions when an occurrence of said first predefined temporal pattern of switch operation of said manually operable switch is determined; and making adjustment of said controlled device in the other of said two opposite directions when an occurrence of said second predefined temporal pattern of switch operation of said manually operable switch is determined.

33. The method of claim 32, wherein:

said controlled device is capable of adjustment in an output level thereof; and said two opposite directions of adjustment are increasing and decreasing directions of adjustment in said output level of said controlled device.

34. The method of claim 27, wherein:

said manually operable switch is a two-position switch having a non-operated, normal position and an operated position at which said two-position switch is kept only when being manually operated.

35. The method of claim 34, wherein:

said two-position switch is a push button switch.

36. The method of claim 34, wherein:

said two-position switch is a touch-sensitive switch.

37. The method of claim 34, wherein:

said two-position switch is a proximity switch.

38. A switch operation processing apparatus for use with a manually operable switch and a controlled device, for controlling said controlled device depending on a switch operation of said manually operable switch, said apparatus comprising:

a detection circuit that detects any occurrence of a switch operation of said manually operable switch;

a determination system that determines when a predefined temporal pattern of switch operation of said manually operable switch occurs; and a controller controlling said controlled device depending on a determination made by said determination system;

wherein said apparatus itself serves as a two-position switch for said controlled device, having on- and off-positions; and wherein said apparatus is placed in said off-position when two successive switch operations of said manually operable switch occur with a time interval therebetween shorter than a predetermined time interval.

39. A switch operation processing apparatus according to claim 38, wherein:

said apparatus is placed in said on-position when a single, isolated operation of said manually operable switch occurs with neither preceding switch operation thereof having occurred within said predetermined time interval before that switch operation nor following switch operation thereof occurring within said predetermined time interval after that switch operation.

40. A switch operation processing apparatus for use with a manually operable switch and a controlled device, for controlling said controlled device depending on a switch operation of said manually operable switch, said apparatus comprising:

a detection circuit that detects any occurrence of a switch operation of said manually operable switch;

a determination system that determines when a predefined temporal pattern of switch operation of said manually operable switch occurs; and a controller controlling said controlled device depending on a determination made by said determination system;

wherein said apparatus itself serves as a two-position switch for said controlled device, having on- and off-positions; and wherein said apparatus is placed in said on-position when two successive switch operations of said manually operable switch occur with a time interval therebetween shorter than a predetermined time interval.

41. A switch operation processing apparatus according to claim 40, wherein:

said apparatus is placed in said off-position when a single, isolated operation of said manually operable switch occurs without a preceding switch operation thereof having occurred within said predetermined time interval before said single, isolated operation and without a following switch operation thereof occurring within said predetermined time interval after said single, isolated operation.

42. A switch operation processing apparatus for use with a manually operable switch and a controlled device, for controlling said controlled device depending on a switch operation of said manually operable switch, said apparatus comprising:

a detection circuit that detects any occurrence of a switch operation of said manually operable switch;

a determination system that determines when a predefined temporal pattern of switch operation of said manually operable switch occurs, which comprises two successive switch operations of said manually operable switch with a time interval therebetween shorter than a predetermined time interval; and a controller controlling said controlled device depending on a determination made by said determination system;

wherein said apparatus itself serves as a three-position switch for said controlled device, having first, second and third positions; and wherein said apparatus changes position among said first, second and third positions depending on a determination made by said determination system.

43. A switch operation processing apparatus for use with a manually operable switch and controlled device, said controlled device being capable of placement in either of two states comprising first and second states, for placing said controlled device in one of said first and second states depending on a switch operation of said manually operable switch, said apparatus comprising:

a detection circuit that detects any occurrence of a switch operation of said manually operable switch;

a determination system that determines when a predefined temporal pattern of switch operation of said manually operable switch occurs; and a controller that changes the state of said controlled device depending on a determination made by said determination system, wherein said controller i) changes the state of said controlled device from said first state to said second state when a first predefined temporal pattern of switch operation of said manually operable switch occurs and ii) maintains the state of said controlled device in said first state when a second predefined pattern of switch operation of said manually operable switch occurs.

44. A switch operation processing apparatus according to claim 43, wherein:

said first predefined temporal pattern of switch operation of said manually operable switch comprises two successive switch operations of said manually operable switch with a time interval therebetween shorter than a predetermined time interval; and said second predefined temporal pattern of switch operation of said manually operable switch comprises a single, isolated operation of said manually operable switch without a preceding switch operation thereof having occurred within said predetermined time interval before said single, isolated operation and without a following switch operation thereof occurring within said predetermined time interval after said single, isolate operation.

45. A switch operation processing apparatus according to claim 44, wherein:

said controlled device comprises a light source used in an endoscope system for generating light for illuminating an object to be observed through said endoscope system;

said manually operable switch comprises a lamp on/off switch for activating said inactivating said light source;

said first state of said controlled device comprises an active state of said light source;

said second state of said controlled device comprises an inactive state of said light source.

46. A switch operation processing apparatus according to claim 44, wherein:

said controlled device comprises an image enhancer used in an endoscope system for making image enhancement to video signals representing an image of an object to be observed through said endoscope system;

said manually operable switch comprises an image enhancement on/off switch for activating and inactivating said image enhancer;

said first state of said controlled device comprises an active state of said image enhancer; and said second state of said controlled device comprises an inactive state of said image enhancer.

* * * * *

UNITED STATES PATENT AND TRADEMARK OFFICE
CERTIFICATE OF CORRECTION

PATENT NO. : 6,255,746 B1  
DATED : July 3, 2001  
INVENTOR(S) : Tadashi Takahashi Page 1 of 1

It is certified that error appears in the above-identified patent and that said Letters Patent is hereby corrected as shown below:

<u>Title page,</u>
Item [73], Assignee, "Asahi Kogako Kogyo, Tokyo (JP)" should be
-- Asahi Kogaku Kogyo Kabushiki Kaisha, Tokyo (JP) --

Signed and Sealed this

Fifth Day of February, 2002

Attest:

JAMES E. ROGAN
*Attesting Officer*     *Director of the United States Patent and Trademark Office*